United States Patent
Kirchmeyer et al.

(10) Patent No.: US 7,090,896 B2
(45) Date of Patent: Aug. 15, 2006

(54) PROCESS FOR PRODUCING DIELECTRIC LAYERS BY USING MULTIFUNCTIONAL CARBOSILANES

(75) Inventors: Stephan Kirchmeyer, Leverkusen (DE); Detlef Gaiser, Köln (DE); Harald Kraus, Leverkusen (DE); Udo Merker, Köln (DE)

(73) Assignee: H.C. Starck GmbH, Goslar (DE)

( * ) Notice: Subject to any disclaimer, the term of this patent is extended or adjusted under 35 U.S.C. 154(b) by 150 days.

(21) Appl. No.: 10/319,121

(22) Filed: Dec. 13, 2002

(65) Prior Publication Data

US 2003/0181537 A1 Sep. 25, 2003

(30) Foreign Application Priority Data

Dec. 19, 2001 (DE) ................. 101 62 443

(51) Int. Cl.
*B05D 3/02* (2006.01)
(52) U.S. Cl. ............ 427/387; 106/287.13; 106/287.14; 106/287.16; 427/58; 427/422; 427/443.2; 521/77; 524/379; 524/386; 524/356; 524/366; 556/479
(58) Field of Classification Search ................. 528/31, 528/33, 35; 427/387; 428/447, 220; 438/781
See application file for complete search history.

(56) References Cited

U.S. PATENT DOCUMENTS

| 5,677,410 | A | 10/1997 | Maget et al. ................. 528/15 |
| 5,906,859 | A | 5/1999 | Bremmer et al. ........... 427/226 |
| 6,005,131 | A | 12/1999 | Jentsch et al. .............. 556/434 |
| 6,042,994 | A | 3/2000 | Yang et al. ................. 430/296 |
| 6,043,330 | A | 3/2000 | Hacker et al. ................ 528/12 |
| 6,054,206 | A | 4/2000 | Mountsier ................ 428/312.8 |
| 6,068,884 | A | 5/2000 | Rose et al. ............. 427/255.6 |
| 6,136,939 | A | 10/2000 | Mager et al. ................. 528/33 |
| 6,143,855 | A | 11/2000 | Hacker et al. ................ 528/31 |
| 6,225,238 | B1 | 5/2001 | Wu ........................... 438/778 |
| 6,395,649 | B1 | 5/2001 | Wu ........................... 438/778 |
| 6,413,638 | B1 | 7/2002 | Mager et al. ............... 428/403 |
| 2001/0055891 | A1* | 12/2001 | Ko et al. .................... 438/780 |
| 2002/0064965 | A1 | 5/2002 | Wu ........................... 438/778 |
| 2003/0198895 | A1* | 10/2003 | Toma et al. ................ 430/314 |
| 2004/0180222 | A1* | 9/2004 | Ogihara et al. ............. 428/447 |
| 2005/0003681 | A1* | 1/2005 | Lyu et al. ................... 438/781 |

* cited by examiner

*Primary Examiner*—Marc S. Zimmer
(74) *Attorney, Agent, or Firm*—Joseph C. Gil

(57) ABSTRACT

A process for producing dielectric layers with low dielectric constants by thermal treatment of a sol-gel product of a multifunctional carbosilane, corresponding layers, and their use in the production of electronic components, are described.

16 Claims, No Drawings

PROCESS FOR PRODUCING DIELECTRIC LAYERS BY USING MULTIFUNCTIONAL CARBOSILANES

CROSS REFERENCE TO RELATED PATENT APPLICATION

The present patent application claims the right of priority under 35 U.S.C. § 119 (a)–(d) of German Patent Application No. 101 62 443.3, filed Dec. 19, 2001.

FIELD OF THE INVENTION

The present invention relates to a process for producing dielectric layers by using multifunctional carbosilanes, the dielectric layers, and their use.

BACKGROUND OF THE INVENTION

Very large-scale integrated microelectronic circuits consist of a plurality of semiconducting elements which are produced by controlled doping and structuring of monocrystalline silicon. These individual semiconductor elements are connected to form a functioning unit by a layer structure, the so-called interconnect, which consists of conductive tracks and the interlayers needed for insulation.

Progressive miniaturisation is placing extreme requirements on the materials that are used. Besides the semiconducting transistors, the properties of the interconnect determine the performance features of these very large-scale integrated microelectronic circuits. These requirements are dictated by the ever-higher clock frequencies and shorter signal propagation times needed for this.

In this case, a high conductance of the conductive-track material and a low dielectric constant of the insulator material are desirable. The miniaturisation of the semiconductor elements and of the interconnect detrimentally affect the component properties. Reducing the conductive-track cross sections increases the resistance of the conductive tracks. The smaller spacing between the conductive tracks, which is filled with insulator material, leads to an electrical interaction between the various conductive tracks and therefore to undesired signal lags. The interactions between the conductive tracks depend to a great extent on the relative permittivity $\in$ (the k value) of the insulator material.

Attempts are being made to counteract these technical difficulties by using conductive materials with a higher conductivity and insulator materials with a lower dielectric constant. For instance, the aluminium previously used as a conductive-track material is being successively replaced by copper, which has a higher conductivity.

Silicon dioxide has to date proved useful, in terms of both its electrical properties and its process properties, as an insulator material in the production of very large-scale integrated circuits. The dielectric constant of silicon dioxide is about 4.0. For modern requirements, however, this value is too high. For new chip generations, dielectric materials with k values significantly lower than 3.0, preferably lower than 2.5, are needed.

The value of the relative permittivity (k value) depends strongly on the temperature at which this value is determined. The values indicated here should be understood to be the values obtained when determined at 22° C. and a pressure of 1 bar.

Besides the dielectric constant (the k value), a number of other properties need to be taken into account for the integration of a new material in a semiconductor process as a replacement for silicon dioxide. For example, the dielectric material must be able to withstand high process temperatures of up to 400° C., which are reached during subsequent metallisation and annealing steps. It is furthermore necessary for the layer materials, or their precursors, to be available at a sufficient purity, since impurities, in particular metals, can detrimentally affect the electrical properties of the layer materials.

The dielectric material should be as easy as possible to work with, and it should be possible to apply it as a thin layer by using a standard industrial method, for example, the spin coating method.

Besides organic polymers, silsesquioxanes and carbon-doped silicon dioxide (SiOC) are described as dielectrics with a dielectric constant lower than 3.0.

Organic polymers, as dielectrics with a low dielectric constant, have gained acceptance in technical fabrication. The properties of these polymers, however, lead to significant problems in process integration. For instance, their limited chemical and mechanical stability at elevated temperatures restricts the subsequent process steps. Requisite polishing steps, for example, are optimised for layers that resemble silicon dioxide, and they often do not lead to optimum results on organic polymer layers.

Silsesquioxanes are siliconorganic polymers which are applied as oligomer solutions in spin coating methods and are then thermally crosslinked. WO 98/47944 A1 teaches the use of organosilsesquioxanes to produce layers with k values lower than 2.7. These compounds, however, are obtainable only via elaborate synthesis routes from trialkoxysilanene. U.S. Pat. No. 5,906,859 teaches the application of oligomeric hydridosilsesquioxanes, which are thermally crosslinked to form polymers. Dielectric constants of 2.7–2.9 are achieved with the compounds described in U.S. Pat. No. 5,906,859.

Carbon-doped silicon dioxide is applied from organosilanes in a PE-CVD method (Plasma Enhanced Chemical Vapour Deposition) with a reactive oxygen plasma.

Carbon-doped silicon dioxide, because of its silicon dioxide matrix, has similar process properties to silicon dioxide, and it is therefore much easier to integrate in the production process. The dielectric constant of these layers is lowered in relation to silicon dioxide by the carbon content. U.S. Pat. No. 6,054,206 teaches the application of such layers from gaseous organosiloxanes. The high-vacuum plasma CVD process, however, is elaborate and entails high costs. Dielectric constants of 2.7–2.9 are likewise achieved with carbon-doped silicon dioxide layers.

WO 99/55526 A1 also describes the production of dielectric layers by means of a CVD process, preferably a plasma CVD process. Starting from organosilicon precursors, layers are obtained which have a backbone structure of Si—O—Si bonds, with organic side groups being bonded to this structure. The CVD process is preferably carried out in such a way that the backbone has ring-like structures. In particular, cyclic organosiloxanes are suitable as precursors. The layers produced according to the examples have dielectric constants between 2.6 and 3.3.

WO 00/75975 A2 teaches the use of polycarbosilanes, which are applied from a solution and are converted into polyorganosilicon layers with k values lower than 2.5 by heat treatment in discrete steps. The polycarbosilanes that are used are hydridopolycarbosilanes, which contain at least one hydrogen atom bonded to silicon, as well as preferably allyl substituents. Si—H bonds, however, are moisture-sensitive and therefore need to be handled accordingly. The platinum compounds that are used to crosslink Si—H compounds with unsaturated groups are undesirable as metallic impurities. In order to obtain layers with low k values, the heat treatment needs to be carried out under accurately controlled conditions, with the need to comply with various fixed temperature steps.

A more general way of further reducing the dielectric constant, i.e., the k value, of dielectric materials is to introduce pores. The air contained in the pores has a k value of close to 1. If air-filled pores are introduced into a dense material, then the average k value of the material is a combination of the k value of the dense material and partially the k value of air. A reduction of the effective k value is hence achieved. The k value of pure silicon dioxide can in this way be reduced from 4.0 to lower than 2.0, although porosities >90% are needed for this (L. Hrubesch, Mat. Res. Soc. Symp. Proc., 381, (1995), 267). Such a high porosity lowers the mechanical stability and compromises the processability of these layers considerably.

The principle is generally applicable to dense dielectric layers. For layers with lower initial k values, it is possible to achieve k values lower than 2.0 with substantially smaller porosities, which in turn benefits the mechanical stability of the layers.

There is, however, a lack of readily obtainable starting materials that are suitable for the production of dielectric layers in a simple thermal method. The German Patent Specification DE 196 03 241 C1 describes the production of multifunctional organosiloxanes, which are used as crosslinkers in inorganic surface coating agents based on silica sol. After drying, these materials form soft films that are ill-suited as dielectric layer materials and have k values significantly higher than 3.

It has now been found, unexpectedly, that it is also possible to produce dielectric layers with low k values by thermal treatment from sol-gel products of multifunctional carbosilanes, for example compounds which are known from DE 196 03 241 C1. In particular, it is in this case possible to use carbosilanes that do not have any Si—H bonds. This is surprising, in particular, against the background of the teaching of WO 00/75975 A2, which states on page 8, last paragraph, that only polycarbosilanes that contain at least one hydrogen atom bonded to silicon are suitable for the production of corresponding dielectric layers.

After the thermal treatment, the dielectric layers according to the invention resemble carbon-doped silicon dioxide in terms of their composition, and they combine low k values with the advantage of a simple heat treatment.

SUMMARY OF THE INVENTION

The invention therefore relates to a process for producing dielectric layers, characterised in that sol-gel products of multifunctional carbosilanes are thermally treated. The invention also relates to dielectric layers which can be produced according to this process. The invention lastly relates to the use of the dielectric layers as insulation layers in the production of microelectronic circuits, particularly very large scale integrated microelectronic circuits, in chip packaging, to make multichip modules, and to produce laminated printed circuit boards and displays.

DETAILED DESCRIPTION OF THE INVENTION

The sol-gel products that may be used in the process according to the invention can be obtained by reacting a multifunctional carbosilane with water in the presence of a catalyst. As carbosilanes, multifunctional carbosilanes are suitable which contain at least 2, preferably at least 3 silicon atoms, which respectively carry 1 to 3 alkoxy or hydroxyl groups, the silicon atoms each being bonded by at least one Si—C bond to a unit linking the silicon atoms.

Examples of suitable linking units in the context of the invention are linear or branched $C_1$ to $C_{10}$ alkylene chains, $C_5$ to $C_{10}$ cycloalkylene radicals, aromatic radicals, for example, phenyl, naphthyl or biphenyl, or combinations of aromatic and aliphatic radicals. The aromatic and aliphatic radicals may also contain heteroatoms, such as Si, N, O or F.

Multifunctional carbosilanes that do not have any Si—H bonds are preferably used. Examples of suitable multifunctional carbosilanes are compounds of the general formula (I)

with $R^1$=alkyl, aryl, preferably $C_1$–$C_{10}$ alkyl, $C_6$–$C_{10}$ aryl, i=2 to 4, preferably i=4, n=1 to 10, preferably n=2 to 4, particularly preferably n=2, $R^2$=alkyl, aryl, preferably $C_1$–$C_{10}$ alkyl, $C_6$–$C_{10}$ aryl, particularly preferably methyl, ethyl, isopropyl a=1 to 3

$R^3$=alkyl, aryl, preferably $C_1$–$C_{10}$ alkyl, $C_6$–$C_{10}$ aryl, particularly preferably methyl.

In the event that a=1, $R^2$ may also be hydrogen.

Further examples are cyclic compounds of the general formula (II)

with m=3 to 6, preferably m=3 or 4 n=2 to 10, preferably n=2, $R^4$=alkyl, aryl, preferably $C_1$–$C_{10}$ alkyl, $C_6$–$C_{10}$ aryl, particularly preferably methyl, ethyl, isopropyl;

in the event that b=1, $R^4$ may also be hydrogen, b=1 to 3, $R^5$=alkyl, aryl, preferably $C_1$–$C_{10}$ alkyl, $C_6$–$C_{10}$ aryl, particularly preferably methyl, $R^6$=$C_1$–$C_6$ alkyl or $C_6$–$C_{14}$ aryl, preferably methyl, ethyl, particularly preferably methyl.

Further examples of polyfunctional carbosilanes are compounds of the general formula (III)

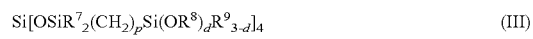

with $R^7$=alkyl, aryl, preferably $C_1$–$C_{10}$ alkyl, $C_6$–$C_{10}$ aryl, particularly preferably methyl, p=1 to 10, preferably p=2 to 4, particularly preferably p=2, $R^8$=alkyl, aryl, preferably $C_1$–$C_{10}$ alkyl, $C_6$–$C_{10}$ aryl, particularly preferably methyl, ethyl, isopropyl;

in the event that d=1, $R^8$ may also be hydrogen,
d=1 to 3,
$R^9$=alkyl, aryl, preferably $C_1$–$C_{10}$ alkyl, $C_6$–$C_{10}$ aryl, particularly preferably methyl.

It is also possible to use oligomers or mixed oligomers of the compounds of formulae (I)–(III) as multifunctional carbosilanes.

Examples of particularly suitable compounds are 1,3,5,7-tetramethyl-1,3,5,7-tetra(2-(diethoxymethylsilyl)ethylene)cyclotetrasiloxane, 1,3,5,7-tetramethyl-1,3,5,7-tetra(2-(hydroxydimethylsilyl)ethylene)cyclotetrasiloxane or oligomers thereof.

In order to produce the sol-gel product, for example, the multifunctional carbosilanes may be mixed with an organic solvent and subsequently reacted with water, optionally in the presence of a catalyst. The way in which such sol-gel processes are carried out is well known to the person skilled in the art. For example, the syntheses of multifunctional organosilanes and organosiloxanes, as well as processes for producing sol-gel coating solutions, are described in EP 743 313 A2, EP 787 734 A1 and WO 98/52992 A1.

Examples of suitable organic solvents are ketones, alcohols, diols, ethers, and mixtures thereof. The purpose of adding the solvent is to give the solution the desired viscosity. Preferred solvents are n-butanol, ethanol and i-propanol. Possible dilutions are 10–90% by weight, preferably 20–50% by weight of multifunctional carbosilane in the solvent.

The addition of water, and optionally a catalyst, initiates a hydrolysis and/or condensation reaction. It is possible to add catalysts, that is to say compounds which accelerate the reaction between the functional groups. Examples of suitable catalysts are organic and inorganic acids, particularly volatile organic or inorganic acids. Examples thereof can be organic acids such as aliphatic monocarboxylic acids with 1 to 10 carbon atoms, for example, formic acid or acetic acid, aromatic carboxylic acids with 7 to 14 carbon atoms, for example benzoic acid, dicarboxylic acids such as oxalic acid, aliphatic and aromatic sulphonic acids, such as p-toluenesulphonic acid, inorganic volatile acids such as hydrochloric acid or nitric acid. The use of p-toluenesulphonic acid is particularly preferred.

The catalysts may be used as aqueous or alcoholic solutions in concentrations of 0.05–5 n, preferably 0.1–1 n. For example, 1–50% by weight, preferably 5–20% by weight of catalyst solution may be added to the carbosilane solution.

Formulations of the multifunctional carbosilanes that have the following composition are particularly preferably used:
20 to 30% by weight of carbosilane,
0 to 10% by weight of 1 n condensation catalyst solution and
60 to 80% by weight of solvent.

The formulations may be stirred for 1–6 h at temperatures between room temperature and the boiling point of the solvent that is used. This measure is used to start the condensation process of the multifunctional carbosilanes.

In order to produce a dielectric layer, the sol-gel product is generally applied to a substrate. In principle, all standard methods are available for applying the layers. These are, for example, spin coating, dip coating, spreading and spraying.

The sol-gel product of the multifunctional carbosilane, or its formulation, is thermally treated after application to a substrate. The thermal treatment is carried out, for example, at temperatures between 100 and 800° C., preferably between 200 and 600° C., particularly preferably between 200 and 400° C. The purpose of this thermal treatment is to complete the crosslinking of the multifunctional carbosilanes and to remove the solvent; the treatment is furthermore used to generate pores. The heat treatment can be carried out in a very straightforward way in a single step at a fixed temperature. It is, however, also possible to carry out the treatment in several steps following a suitable temperature and time profile. Suitable temperature and time profiles depend on the multifunctional carbosilanes, the catalyst and the amount of solvent, and they can be determined through preliminary trials.

Preferably, the crosslinking of the layers is carried out at temperatures of 100–150° C. for a duration of 5–120 min prior to the thermal treatment.

The pore generation is achieved by heat treatment above a temperature at which parts of the carbosilane decompose and are released as gaseous constituents. This takes place from temperatures higher than about 220° C., depending on the multifunctional carbosilanes that are used.

It is also possible to add pore-forming substances, such as high-boiling solvents or foaming agents, to the sol-gel product prior to application. These remain during the crosslinking in the layer and do not evaporate, and/or decompose to give gaseous products, until the subsequent heat treatment.

The heat treatment may be carried out with the aid of standard ovens, RTP (Rapid Thermal Processing) ovens, hotplates etc. It is also possible, however, to supply the energy needed for the crosslinking and pore formation with the aid of microwaves, IR light, laser or other energetic electromagnetic radiation. The heat treatment is preferably carried out in an oven or on a hotplate.

The heat treatment may be carried out in air or other gases. The heat treatment is preferably carried out in air or in nitrogen.

During this, thermally labile constituents of the layer are pyrolytically broken down, so that gas-filled pores are left behind.

In a further embodiment of the invention, after the application and the heat treatment the layers are subjected to a further processing step which is used to make the pore surface hydrophobic. The k value of a siliconorganic material can be lowered further by chemical conversion of Si—OH groups into Si—O—$SiR_3$ groups. To that end, the surface is treated with suitable compounds, for example, trichloromethylsilane or hexamethylenedisilazane. Further details of the procedure and other examples are described, for example, in WO 99/36953 A1.

The invention also relates to dielectric layers which can be obtained by the process according to the invention.

The layers according to the invention are distinguished by k values lower than 2.8, preferably lower than 2.5, particularly preferably lower than 2.0, the k value depending, in particular, on the choice of the multifunctional carbosilane and the conditions of the thermal treatment of the sol-gel product.

The layers preferably have a layer thickness of from 0.01 to 100 μm.

The layers according to the invention may, for example, be used as dielectric insulation layers in the production of microelectronic circuits, in chip packaging, to make multichip modules, and to produce laminated printed circuit boards and displays.

The substrate to be used, onto which a dielectric layer according to the invention will be applied, is dictated by the application. It is possible to use any substrates which can be coated by the aforementioned techniques, such as spin and dip coating, spreading or spraying, and which can withstand the temperatures encountered during the heat treatment, for example structured and unstructured silicon wafers, structured and unstructured wafers of other semiconductors, for example gallium arsenide or silicon germanide, structured or unstructured glass plates provided with conductive layers or suitable structured and unstructured thermostable plastic substrates.

EXAMPLES

The compounds mentioned in the examples can be produced according to EP 743 313 A2, EP 787 734 A1 or WO 98/52992 A1.

The layer thicknesses of the applied films were measured using a surface profiler (Alpha-Step 500, KLA-Tencor).

The dielectric constant k was determined by measuring the capacitance C of a model parallel plate capacitor. The following applies:

$$C = k\varepsilon_0 \frac{A}{d} \quad (1)$$

where A is the area of the capacitor plate, d is the plate separation and $\varepsilon_0 = 8.8542 \cdot 10^{-12}$ As/Vm is the permittivity free space. A capacitor was prepared for each sample. To that end, a 0.5–1 µm thick film of the compositions described in the examples was applied, using the spin coating method, to an electrically conductive ITO glass platelet (ITO=indium tin oxide) of size 25 mm×25 mm, with a narrow strip being adhesively bonded so that contact can be made subsequently. The counterpart contact on the layer was provided by a gold electrode (diameter about 5 mm) that was sputtered on.

The capacitance was measured using an impedance spectrometer (EG&G 398). To that end, without a bias voltage, the impedance Z of the model parallel plate capacitor was determined in a range of 10–100000 Hz. The capacitance C of the model capacitor is obtained from the impedance Z according to:

$$Z = \frac{R}{\sqrt{1 + (\omega RC)^2}}, \quad (2)$$

where $\omega$ is the angular frequency of the applied AC voltage and R represents a high-value resistor in parallel with the capacitance C.

Example 1

4.4 g of 1,3,5,7-tetramethyl-1,3,5,7-tetra(2-(diethoxymethylsilyl)ethylene)cyclotetrasiloxane dissolved in 12.2 g of i-propanol were mixed with 1.0 g of 0.1 n aqueous p-toluenesulphonic acid solution. The mixture was stirred for 1 h at room temperature. 200 µl of the mixture were spun, with the aid of a commercially available spin coater, onto a glass substrate at 2000 rpm and heated to 130° C. for 2 h. The layer thickness of the film was then 0.61 µm, and the k value was 2.7.

Example 2

3.24 g of 1,3,5,7-tetramethyl-1,3,5,7-tetra(2-(hydroxydimethylsilyl)-ethylene)cyclotetrasiloxane dissolved in 8.7 g of i-propanol were mixed with 1.0 g of 0.1 n aqueous p-toluenesulphonic acid solution. The mixture was stirred for 1 h at room temperature. 200 µl of the mixture were spun at 2000 rpm onto a glass substrate, heated to 130° C. for 1 h and then annealed for 1 h at 200° C. under nitrogen. The layer thickness of the annealed film was 1.44 µm, and the k value was 1.8.

Example 3

200 µl of the mixture from Example 2 were spun at 2000 rpm onto a glass substrate, heated to 130° C. for 2 h and then annealed for 1 h at 400° C. under nitrogen. The layer thickness of the annealed film was 0.57 µm, and the k value was 2.5.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A process for producing dielectric layers, comprising:
    (a) providing a composition comprising,
        (i) a sol-gel product of at least one multifunctional carbosilane, said multifunctional carbosilane being free of Si—H bonds and being selected from one or more compounds represented by the following general formula (I), or oligomers thereof, $$R^1{}_{4-i}Si[(CH_2)_nSi(OR^2)_aR^3{}_{3-a}]_i \quad (I)$$

in which,
        $R^1$=alkyl, or aryl,
        i=2 to 4,
        n=1 to 10,
        $R^2$=alkyl, or aryl,
        a=1 to 3 and
        $R^3$=alkyl, or aryl, and
        in the event that a=1, $R^2$ may also be hydrogen, and
        (ii) a pore-forming material selected from the group consisting of high-boiling solvents, foaming agents and thermally labile constituents;
    (b) applying said composition to a substrate; and
    (c) thermally treating said composition applied to said substrate at a temperature of 200 to 600° C. in an atmosphere selected from air and nitrogen, thereby forming said dielectric layer, said dielectric layer having a porosity,
wherein the porosity of said dielectric layer is formed by evaporation or decomposition of said pore-forming material during the thermal treatment step,
further wherein said thermal treatment step is conducted by means selected from the group consisting of a standard industrial oven, a hotplate, microwave energy, IR light, laser light and other energetic electromagnetic radiation.

2. The process of claim 1, wherein the multifunctional carbosilane further comprises one or more compound(s) represented by the general formula (II), or oligomers thereof:

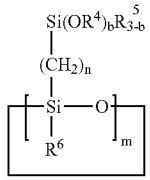

wherein,
m=3 to 6,
n=2 to 10,
$R^4$=alkyl, or aryl, and
in the event that =1, $R^4$ may also be hydrogen,
b=1 to 3,
$R^5$=alkyl, or aryl,
$R^6$=$C_1$–$C_6$ alkyl or $C_6$–$C_{14}$ aryl.

3. The process of claim 1, wherein the multifunctional carbosilane further comprises one or more compound(s) represented by the general formula (Ill), or oligomers thereof:

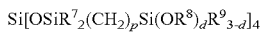

wherein
$R^7$=alkyl, or aryl,
p=1 to 10,
$R^8$=alkyl, or aryl, and
in the event that d=1, $R^8$=may also be hydrogen,
d=1 to 3,
$R^9$=alkyl, or aryl.

4. The process of claim 1, wherein the dielectric layers have dielectric constants lower than 2.8.

5. The process of claim 1, wherein the dielectric layers have dielectric constants lower than 2.5.

6. The process of claim 1, wherein organic solvents selected from the group consisting of ketones, alcohols, diols, ethers or mixtures thereof are added to the multifunctional carbosilanes during the production of the sol-gel product.

7. The process of claim 1, wherein volatile organic or inorganic acids are added to the multifunctional carbosilanes as catalysts during the production of the sol-gel product.

8. The process of claim 1, wherein said composition is applied to said substrate by an application method selected from the group consisting of spreading, spin coating, dip coating and spraying.

9. The process of claim 1, wherein, after the thermal treatment, the dielectric layers are subjected to a further treatment in which the number of hydroxyl groups on the surface is reduced.

10. Dielectric layers produced by the process of claim 1.

11. Dielectric layers according to claim 10, wherein the layers have a layer thickness of 0.01–100 μm.

12. An article of manufacture comprising the dielectric layer of claim 1, wherein said article of manufacture is selected from the group consisting of integrated microelectronic circuits, chip packaging, multichip modules, and laminated printed circuit boards and displays.

13. The process of claim 1 wherein said substrate is selected from the group consisting of structured silicon wafers, unstructured silicon wafers, structured gallium arsenide wafers, unstructured gallium arsenide wafers, structured wafers of silicon germanide, unstructured wafers of silicon germanide, structured glass plates having conductive layers, unstructured glass plates having conductive layers, structured thermoplastic substrates and unstructured thermoplastic substrates.

14. The process of claim 1 wherein said substrate is selected from the group consisting of unstructured silicon wafers, structured gallium arsenide wafers, unstructured gallium arsenide wafers, structured wafers of silicon germanide and unstructured wafers of silicon germanide.

15. A process for producing dielectric layers, comprising:
(a) providing a composition comprising,
(i) a sol-gel product of at least one multifunctional carbosilane, said multifunctional carbosilane being free of Si—H bonds and being selected from one or more compounds represented by the following general formula (III), or oligomers thereof,

in which
$R^7$=alkyl, or aryl,
p=1 to 10,
$R^8$=alkyl, or aryl, and
in the event that d=1, $R^8$=may also be hydrogen,
d=1 to 3, and
$R^9$=alkyl, or aryl
and
(ii) a pore-forming material selected from the group consisting of high-boiling solvents, foaming agents and thermally labile constituents;
(b) applying said composition to a substrate; and
(c) thermally treating said composition applied to said substrate at a temperature of 200 to 600° C. in an atmosphere selected from air and nitrogen, thereby forming said dielectric layer, said dielectric layer having a porosity,
wherein the porosity of said dielectric layer is formed by evaporation or decomposition of said pore-forming material during the thermal treatment step,
further wherein said thermal treatment step is conducted by means selected from the group consisting of a standard industrial oven, a hotplate, microwave energy, IR light, laser light and other energetic electromagnetic radiation.

16. The process of claim 15, wherein the multifunctional carbosilane further comprises one or more compounds represented by the following general formula (II), or oligomers thereof:

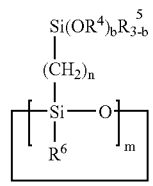

wherein,
m=3 to 6,
n=2 to 10,
$R^4$=alkyl, or aryl, and
in the event that =1, $R^4$ may also be hydrogen,
b=1 to 3,
$R^5$=alkyl, or aryl,
$R^6$=$C_1$–$C_6$ alkyl or $C_6$–$C_{14}$ aryl.

* * * * *

UNITED STATES PATENT AND TRADEMARK OFFICE
CERTIFICATE OF CORRECTION

| | | |
|---|---|---|
| PATENT NO. | : 7,090,896 B2 | Page 1 of 1 |
| APPLICATION NO. | : 10/319121 | |
| DATED | : August 15, 2006 | |
| INVENTOR(S) | : Stephan Kirchmeyer et al. | |

It is certified that error appears in the above-identified patent and that said Letters Patent is hereby corrected as shown below:

In the Claims:

In Claim 16 (column 10, line 61) delete "=1" and insert -- b=1 --.

Signed and Sealed this

Third Day of April, 2007

JON W. DUDAS
*Director of the United States Patent and Trademark Office*